United States Patent [19]

Smithers

[11] Patent Number: 5,640,305

[45] Date of Patent: Jun. 17, 1997

[54] ANCHOR FOR SECURING A HEAT SINK TO A PRINTED CIRCUIT BOARD

[75] Inventor: Matthew Smithers, Lewisville, Tex.

[73] Assignee: Thermalloy, Inc., Dallas, Tex.

[21] Appl. No.: 663,600

[22] Filed: Jun. 14, 1996

Related U.S. Application Data

[63] Continuation of Ser. No. 477,794, Jun. 7, 1995, abandoned.

[51] Int. Cl.$^6$ .................................................... H05K 7/20
[52] U.S. Cl. ........................... 361/719; 24/588; 248/510; 257/719; 361/809
[58] Field of Search .................................... 248/500, 510; 411/501, 502, 904; 439/73, 331, 485, 487; 24/297, 453, 457, 458, 472, 473, 588, 589, 625; 174/16.3; 267/150, 160; 165/80.3, 185; 257/706, 707, 713, 719, 727; 361/690, 704, 707, 717–719, 769, 784, 807, 809, 810

[56] References Cited

U.S. PATENT DOCUMENTS

| | | | |
|---|---|---|---|
| 3,836,704 | 9/1974 | Coules | 174/138 D |
| 4,321,423 | 3/1982 | Johnson | 174/16.3 |
| 4,427,316 | 1/1984 | Moore | 403/2 |
| 4,521,148 | 6/1985 | Tanaka | 411/182 |
| 4,660,123 | 4/1987 | Hermann | 361/386 |
| 4,745,456 | 5/1988 | Clemens | 361/386 |
| 4,841,100 | 6/1989 | Isnasiak | 174/138 G |
| 4,884,331 | 12/1989 | Hinshaw | 29/558 |
| 4,891,735 | 1/1990 | Mikolajczak | 361/809 |
| 5,132,875 | 7/1992 | Plesinger | 361/386 |
| 5,329,426 | 7/1994 | Villani | 361/704 |
| 5,371,652 | 12/1994 | Clemens | 361/704 |
| 5,384,940 | 1/1995 | Soule | 361/809 |
| 5,386,338 | 1/1995 | Jordan | 361/704 |
| 5,436,798 | 7/1995 | Wiedland, Jr. | 361/710 |
| 5,485,351 | 1/1996 | Hopfer | 361/704 |

OTHER PUBLICATIONS

Thermalloy Semiconductor Accessories Catalog, pp. 15–29, 1990.

*Primary Examiner*—Gerald P. Tolin
*Attorney, Agent, or Firm*—Woodcock Washburn Kurtz Mackiewicz & Norris LLP

[57] ABSTRACT

An anchor for mounting a heat sink and an electronic device on a printed circuit board has a plastic body. An arcuate groove or protruberance is engaged by a spring. The anchor has a neck which is inserted into a hole in a printed circuit board. A pin in a hole in the body is pushed into the neck to spread it to secure the anchor to the printed circuit board. The assembly is formed by attaching a wire or clip spring to the anchor.

7 Claims, 5 Drawing Sheets

ANCHOR FOR SECURING A HEAT SINK TO A PRINTED CIRCUIT BOARD

This is a continuation of application Ser. No. 08/477,794 filed Jun. 7, 1995 now abandoned.

FIELD OF THE INVENTION

This invention relates to securing electronic components together. More particularly, it relates to an anchor for mounting a heat sink and an electronic device on a printed circuit board with a spring.

BACKGROUND OF THE INVENTION

A heat sink placed in contact with an electronic device transfers heat through conduction from the semi-conductor device contained in the electronic package. U.S. Pat. No. 4,884,331-Hinshaw shows a commonly used pin fin heat sink.

Springs or clips such as shown in U.S. Pat. No. 4,745,456 Clemens, or U.S. Pat. No. 4,660,123-Hermann have been used to secure heat sinks to electronic devices. The catalog Thermalloy Semiconductor Accessories, pp. 15–29, shows clips for attaching heat sinks to electronic devices.

Page 17 of that catalog shows two types of wire springs for securing a heat sink to a pin grid array (PGA). Co-pending application Ser. No. 349,672, filed Dec. 5, 1994, "Strap for Heat Sink Clip Assembly", shows and describes several different clips for securing a heat sink to an electronic device.

It is an object of the present invention to provide an anchor which can be inserted into a printed circuit board to secure a heat sink and an electronic device to the board.

SUMMARY OF THE INVENTION

In accordance with the present invention, an anchor can be inserted into a printed circuit board to secure a heat sink to an electronic device. The anchor includes a plastic body having a projection for engaging a spring which clamps the heat sink to the electronic device. A neck on the plastic body fits into an opening in the printed circuit board. The plastic body has a hole which extends into a neck on the body. A pin in the hole spreads the neck after insertion into the printed circuit board. The diameter of the hole in the neck is smaller than the diameter of the pin, so that the neck is spread as the pin is pushed into the neck.

The body of the anchor and the pin are plastic which may be formed in a continuous extruded strip. The spring that clamps the heat sink to the electronic device may be a wire spring or a clip spring.

The foregoing and other objects, features and advantages of the invention will be better understood from the following more detailed description and appended claims.

SHORT DESCRIPTION OF THE DRAWINGS

DESCRIPTION OF THE PREFERRED EMBODIMENT

Figure 1:
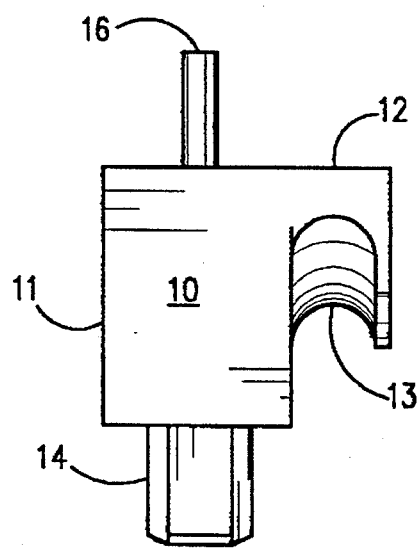
FIGS. 1, 1A and 1B are side, front and top views respectively of the anchor.
Figure 1A:
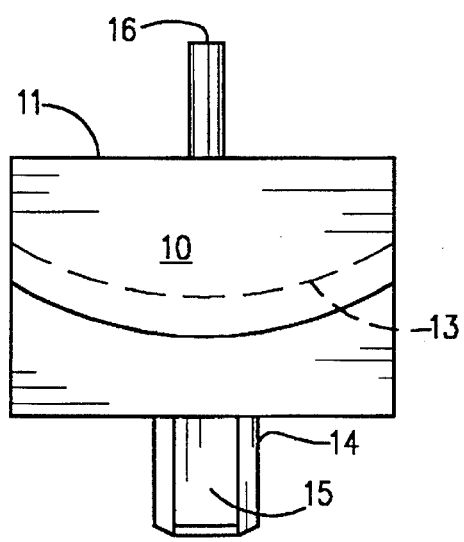
Figure 1B:
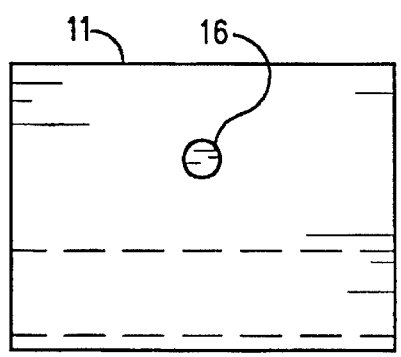

An anchor of the present invention, denoted by the reference numeral 10, has a plastic body 11 which has a projection or protuberance 12 for engaging a spring which secures a heat sink to an electronic device. More particularly, the projection has an arcuate groove 13 which engages springs of the type shown on page 17 of the aforementioned Thermalloy catalog to secure a heat sink/electronic device assembly to a printed circuit board.

The anchor has a neck 14 which fits into an opening in the printed circuit board. A hole 15 extends through the body into the neck of the anchor.

Figure 2:
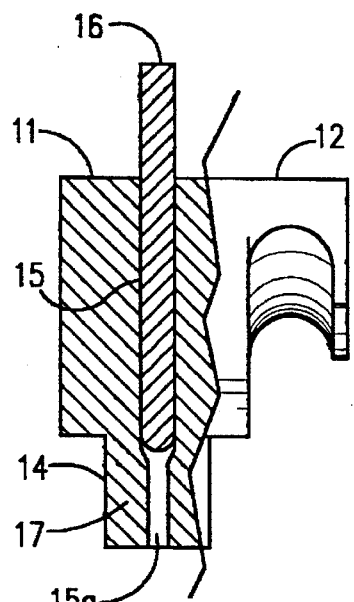
FIGS. 2 and 2A are side and front cross-section views.
Figure 2A:
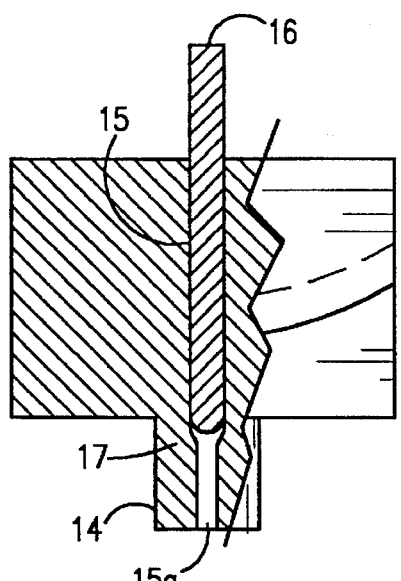
Figure 3:
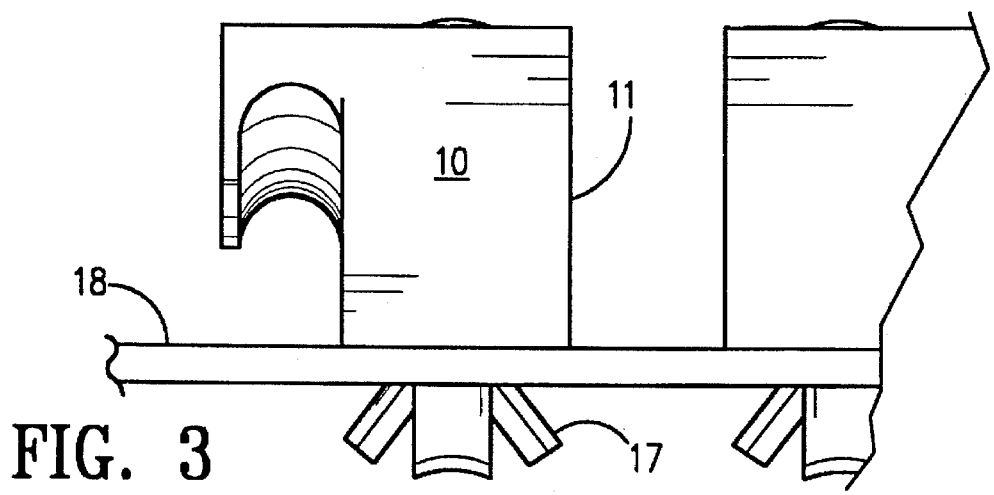
FIGS. 3 and 3A are side and side cross-section views of the anchor with the neck spread to secure it to a printed circuit board.
Figure 3A:
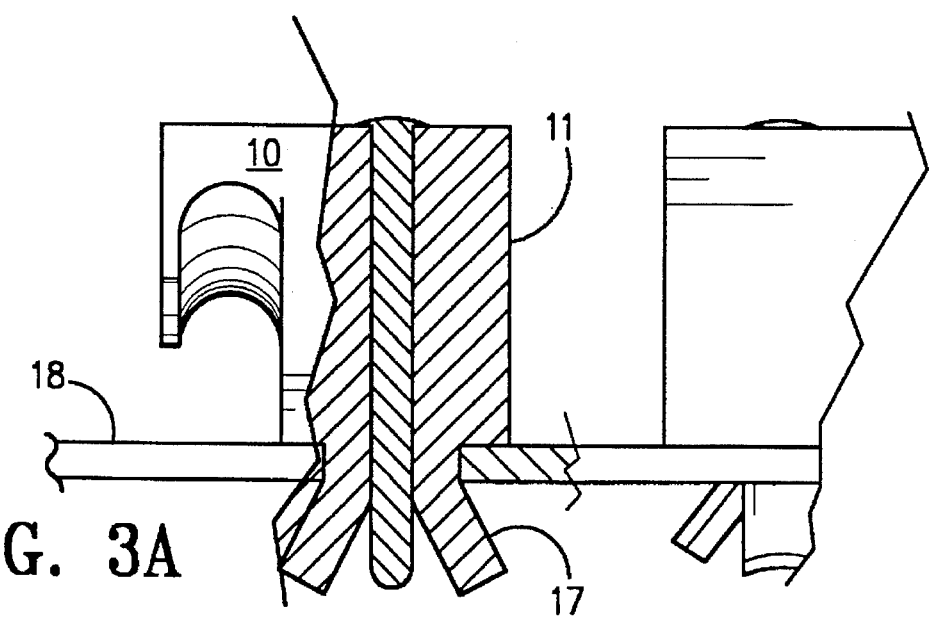

A pin 16 is in the hole. As best shown in FIGS. 2 and 2A, neck 14 has a spreadable portion 17 with a hole 15a which is smaller than the diameter of pin 16. Since it is smaller than the diameter of the pin, the neck is spread as the pin 16 is pushed into the neck. The spread portion 17 locks the anchor to the printed circuit board 18 as is best shown in FIG. 3 and 3A.

Figure 4:
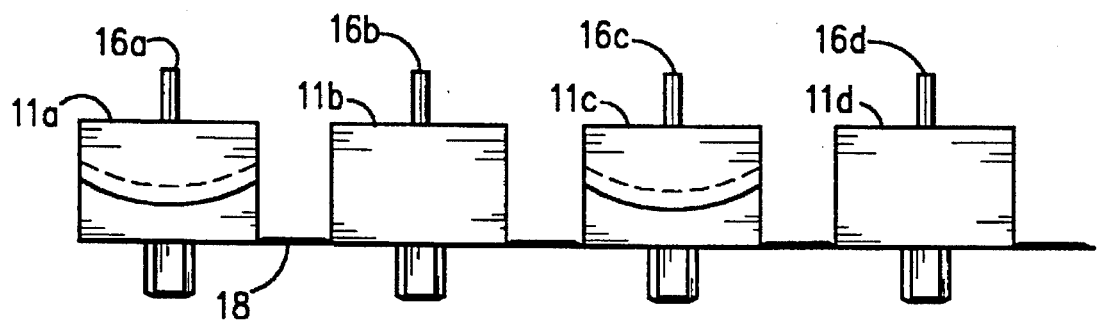
FIG. 4 shows anchors which have been injected molded on a plastic strip.

FIG. 4 shows a plurality of anchors 11a–11d which have been injection molded on a common extrusion strip 18. The bodies 11a–11d and the pins 16a–16d are all plastic and can be formed in a continuous extrusion process.

Figure 5:
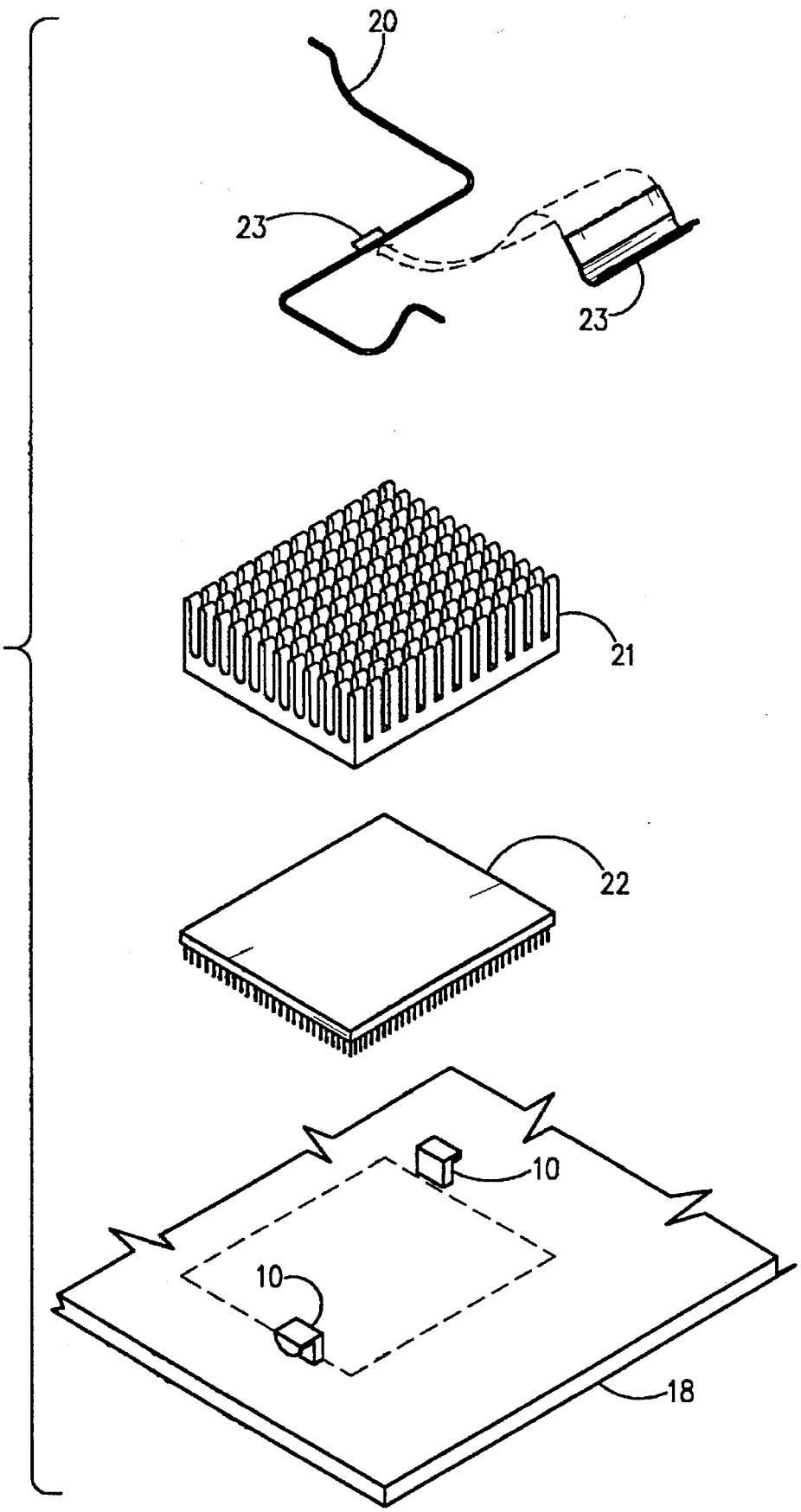
FIG. 5 is an exploded view showing the anchor used to secure a pin fin heat sink to an electronic device with a wire spring.

FIG. 5 is an exploded view which depicts the assembly of a wire spring 20 with a pin fin heat sink 21 and an electronic device 22. These components are secured to the printed circuit board 18 by the anchor 10. The anchor 10 is secured to the printed circuit board by the spread portion of the neck below a hole in the printed circuit board as previously described. The clip 23 holds the spring 20 in the heat sink 21 during shipment. The assembly of components is made by securing two anchors 10 to the printed circuit board 18, then using the wire spring 20 to fasten the heat sink to the anchors.

Figure 6:
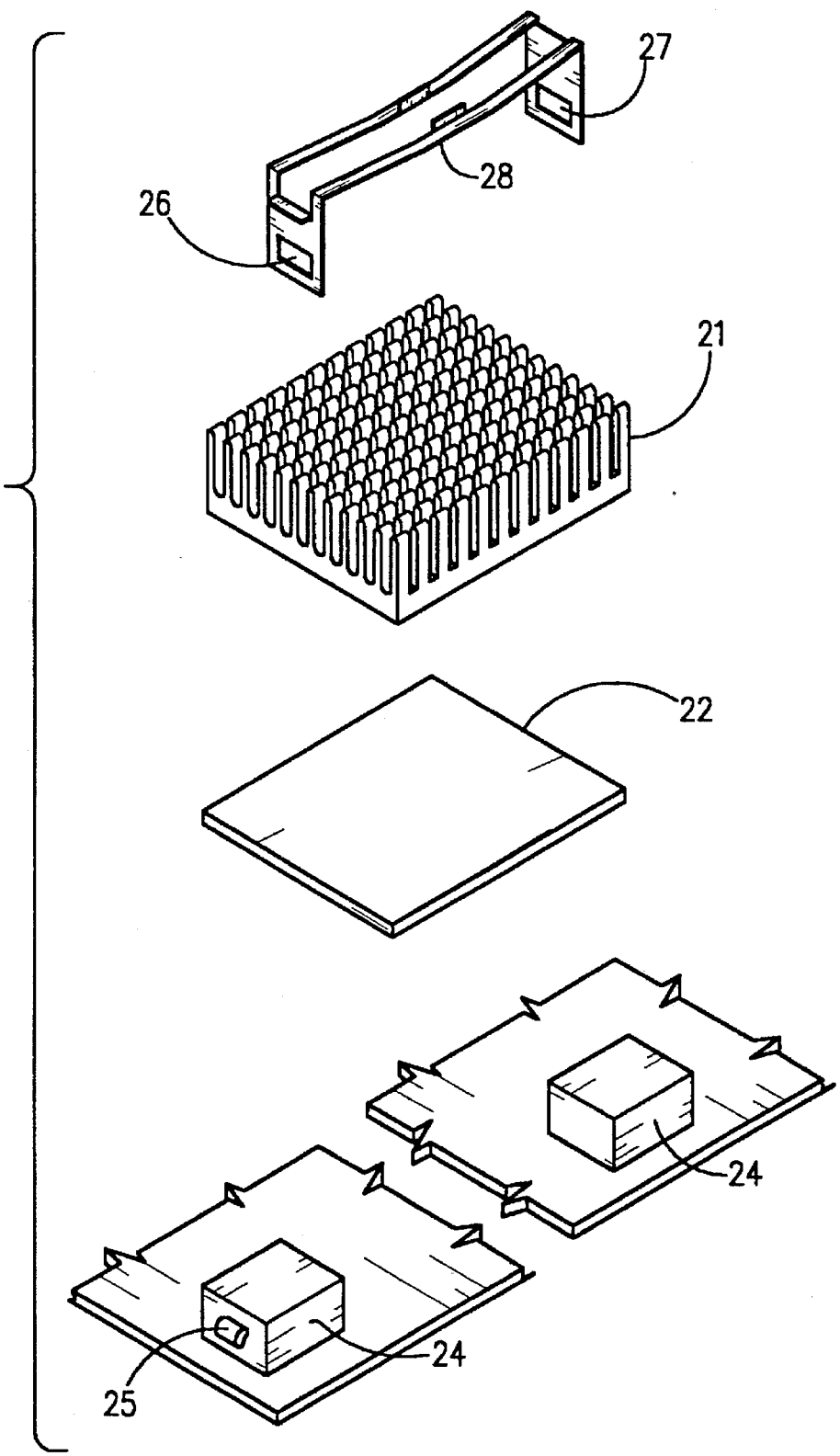
FIG. 6 is an exploded view of an anchor used to secure a pin fin heat sink to an electronic device with a clip spring.

FIG. 6 shows a different embodiment of an anchor 24. This modification has a protruberance 25 which engages holes 26 and 27 in two legs of the clip spring 28. This clip spring is more fully described in co-pending application Ser. No. 349,672, filed Dec. 5, 1994, "Strap Spring For Heat Sink Clip Assembly", which is incorporated herein by reference.

Figure 7:
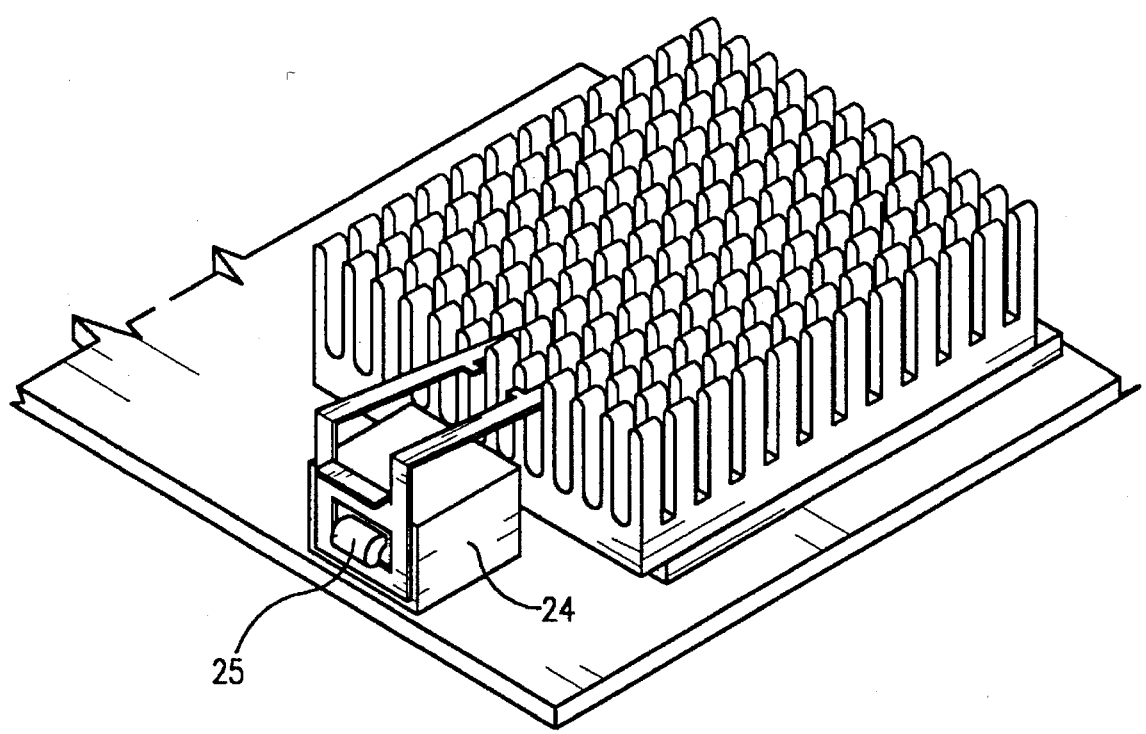
FIG. 7 shows an assembled heat sink and electronic device anchored with a single clip spring.

FIG. 7 shows the completed assembly using an embodiment of a clip spring shown in the aforementioned co-pending application having only one leg. With this embodiment, a single anchor can be used to secure the clip spring to the printed circuit board and other anchors secure a like clip to the other side of the heat sink.

Various other modifications may be made. The appended claims, are, therefore to cover all such modifications within the spirit and scope of the invention.

What is claimed is:

1. The combination of a printed circuit board, a heat sink, an electronic device, a spring securing said heat sink to said electronic device, and an anchor inserted into an opening in said printed circuit board comprising:

a printed circuit board having a plurality of openings which are spaced on said printed circuit board;

said anchor comprising:

a plastic body having a width which is substantially the same size but slightly larger than each of said openings and substantially smaller than the spacing between any two of said openings in said printed circuit board, said body having a continuous projection which extends the entire width of the body, said project engaging said spring, said body having a neck of smaller size which fits into one of said openings in said circuit board, and a hole in said body; and a pin in said hole in said body, said pin spreading said neck to lock said anchor to said printed circuit board by the spread portion of said neck;

said spring engaging said projection on said body and engaging said heat sink which holds said electronic device on said printed circuit board.

2. The combination recited in claim 1 wherein said neck has a hole which is smaller than the diameter of said pin so that said neck is spread as said pin enters said neck.

3. The combination recited in claim 1 wherein said continuous projection engaging said spring is a projection having an arcuate groove.

4. The combination recited in claim 3 said spring being a wire fitting in said arcuate groove and over said heat sink to secure said electronic device.

5. The combination recited in claim 1 wherein said continuous projection engaging said spring is a protuberance and wherein said spring is a clip having a leg with a hole in the extremity thereof, said protuberance fitting into said hole to secure said clip spring.

6. The combination recited in claim 5 wherein said clip is U-shaped with two legs, and wherein two of said anchors are secured on said printed circuit board, a protuberance on each anchor fitting into a hole in each leg.

7. The combination cited in claim 1 wherein said pin is plastic.

* * * * *

UNITED STATES PATENT AND TRADEMARK OFFICE
CERTIFICATE OF CORRECTION

PATENT NO. : 5,640,305
DATED : June 17, 1997
INVENTOR(S) : Matthew Smithers

It is certified that error appears in the above-indentified patent and that said Letters Patent is hereby corrected as shown below:

Col. 2, line 13, after "projection" insert --or protuberance--.

Col. 3, line 4, "project" should be --projection--.

Signed and Sealed this

Twenty-fifth Day of November, 1997

Attest:

BRUCE LEHMAN

*Attesting Officer*  *Commissioner of Patents and Trademarks*